United States Patent
Murphy et al.

(10) Patent No.: US 10,717,669 B2
(45) Date of Patent: Jul. 21, 2020

(54) APPARATUS AND METHOD FOR CREATING CRACK INITIATION SITES IN A SELF-FRACTURING FRANGIBLE MEMBER

(71) Applicant: Palo Alto Research Center Incorporated, Palo Alto, CA (US)

(72) Inventors: Kathryn Murphy, San Francisco, CA (US); Scott J. Limb, Palo Alto, CA (US); David Mathew Johnson, San Francisco, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 16 days.

(21) Appl. No.: 15/981,328

(22) Filed: May 16, 2018

(65) Prior Publication Data

US 2019/0352216 A1 Nov. 21, 2019

(51) Int. Cl.

| | | |
|---|---|---|
| C03B 33/10 | (2006.01) | |
| H01L 23/00 | (2006.01) | |
| B24B 1/04 | (2006.01) | |
| B06B 1/06 | (2006.01) | |
| H01L 41/09 | (2006.01) | |

(52) U.S. Cl.
CPC .......... *C03B 33/105* (2013.01); *B06B 1/0607* (2013.01); *B24B 1/04* (2013.01); *H01L 23/57* (2013.01); *H01L 41/0906* (2013.01)

(58) Field of Classification Search
CPC ...... H01L 23/57; H01L 23/573; H01L 23/576
USPC ....................................................... 257/922
See application file for complete search history.

(56) References Cited

U.S. PATENT DOCUMENTS

| | | | |
|---|---|---|---|
| 2,529,210 | A | * 11/1950 | Butler ............... B26D 3/08 |
| | | | 83/883 |
| 3,397,278 | A | 8/1968 | Pomerantz |
| 3,601,114 | A | 8/1971 | Cook |
| 3,666,967 | A | 5/1972 | Keister et al. |
| 3,673,667 | A | 7/1972 | Loewenstein et al. |
| 3,882,323 | A | 5/1975 | Smolker |
| 4,102,664 | A | 7/1978 | Dumbaugh, Jr. |
| 4,139,359 | A | 2/1979 | Johnson et al. |

(Continued)

FOREIGN PATENT DOCUMENTS

| | | |
|---|---|---|
| DE | 102004015546 | 10/2005 |
| WO | WO2001043228 | 6/2001 |

OTHER PUBLICATIONS

File History for U.S. Appl. No. 15/220,164.

(Continued)

*Primary Examiner* — Kenneth E Peterson
(74) *Attorney, Agent, or Firm* — Mueting Raasch Group

(57) ABSTRACT

An apparatus comprises a stressed glass member and an actuator mounted on the stressed glass member. A power source is coupled to the actuator. An abrasion structure is disposed between the actuator and the stressed glass member. The abrasion structure comprises abrading features in contact with the stressed glass member. The abrading features have a hardness higher than a hardness of the stressed glass member. When energized by the power source, the actuator is configured to induce movement of the abrasion structure that causes the abrading features to create scratches in the stressed glass member to a depth sufficient to initiate fracture of the stressed glass member.

21 Claims, 10 Drawing Sheets

(56) References Cited

U.S. PATENT DOCUMENTS

| | | | |
|---|---|---|---|
| 4,471,895 A * | 9/1984 | Lisec, Jr. | C03B 33/078 225/2 |
| 4,558,622 A * | 12/1985 | Tausheck | B26D 3/085 225/96.5 |
| 4,598,274 A | 7/1986 | Holmes | |
| 4,673,453 A | 6/1987 | Georgi | |
| 4,739,555 A * | 4/1988 | Jurgens | C03B 33/078 225/96 |
| 5,374,564 A | 12/1994 | Bruel | |
| 5,584,219 A * | 12/1996 | Dunn | A62B 3/00 83/745 |
| 5,791,056 A * | 8/1998 | Messina | A62B 3/005 30/361 |
| 6,418,628 B1 * | 7/2002 | Steingass | A62B 3/005 30/366 |
| 7,002,517 B2 | 2/2006 | Nougeim | |
| 7,153,758 B2 | 12/2006 | Hata et al. | |
| 7,554,085 B2 | 6/2009 | Lee | |
| 7,880,248 B1 * | 2/2011 | Pham | H01L 23/573 257/417 |
| 8,130,072 B2 | 3/2012 | De Bruyker et al. | |
| 9,154,138 B2 * | 10/2015 | Limb | H01L 23/14 |
| 9,294,098 B2 * | 3/2016 | Shah | H03K 19/17768 |
| 9,356,603 B2 * | 5/2016 | Limb | B32B 17/00 |
| 9,577,047 B2 | 2/2017 | Chua et al. | |
| 9,630,870 B2 | 4/2017 | Zhao et al. | |
| 9,780,044 B2 | 10/2017 | Limb et al. | |
| 10,026,651 B1 * | 7/2018 | Limb | C03C 21/002 |
| 10,308,543 B2 * | 6/2019 | Lee | C03B 33/033 |
| 2003/0089755 A1 * | 5/2003 | Peers-Smith | A62B 3/005 225/103 |
| 2004/0031966 A1 | 2/2004 | Forrest | |
| 2004/0222500 A1 | 11/2004 | Aspar et al. | |
| 2005/0061032 A1 | 3/2005 | Yoshizawa | |
| 2005/0082331 A1 * | 4/2005 | Yang | A62B 3/005 225/2 |
| 2005/0084679 A1 | 4/2005 | Sglavo et al. | |
| 2005/0176573 A1 | 8/2005 | Thoma et al. | |
| 2006/0138798 A1 | 6/2006 | Oehrlein | |
| 2006/0270190 A1 | 11/2006 | Nastasi et al. | |
| 2007/0113886 A1 | 5/2007 | Arao et al. | |
| 2008/0029195 A1 | 2/2008 | Lu | |
| 2008/0311686 A1 | 12/2008 | Morral et al. | |
| 2009/0086170 A1 | 4/2009 | El-ghoroury et al. | |
| 2010/0035038 A1 | 2/2010 | Barefoot et al. | |
| 2010/0133641 A1 | 6/2010 | Kim | |
| 2010/0225380 A1 | 9/2010 | Hsu et al. | |
| 2010/0301088 A1 * | 12/2010 | Purdy | A62B 3/005 225/103 |
| 2011/0048756 A1 | 3/2011 | Shi et al. | |
| 2011/0089506 A1 * | 4/2011 | Hoofman | G06F 21/87 257/417 |
| 2011/0183116 A1 | 7/2011 | Hung et al. | |
| 2012/0052252 A1 | 3/2012 | Kohli et al. | |
| 2012/0135177 A1 | 5/2012 | Comejo et al. | |
| 2012/0135195 A1 | 5/2012 | Glaesemann et al. | |
| 2012/0196071 A1 | 8/2012 | Cornejo et al. | |
| 2012/0288676 A1 | 11/2012 | Sondergard et al. | |
| 2013/0037308 A1 | 2/2013 | Wang et al. | |
| 2013/0082383 A1 | 4/2013 | Aoya | |
| 2013/0140649 A1 | 6/2013 | Rogers et al. | |
| 2013/0192305 A1 | 8/2013 | Black et al. | |
| 2013/0273717 A1 * | 10/2013 | Hwang | B23K 26/02 438/463 |
| 2014/0091374 A1 | 4/2014 | Assefa et al. | |
| 2014/0103957 A1 | 4/2014 | Fritz et al. | |
| 2014/0266946 A1 | 9/2014 | Bily et al. | |
| 2014/0300520 A1 | 10/2014 | Nguyen et al. | |
| 2014/0323968 A1 | 10/2014 | Rogers et al. | |
| 2015/0001733 A1 | 1/2015 | Karhade et al. | |
| 2015/0044445 A1 | 2/2015 | Garner et al. | |
| 2015/0076677 A1 | 3/2015 | Ebefors et al. | |
| 2015/0089977 A1 | 4/2015 | Li | |
| 2015/0102852 A1 | 4/2015 | Limb et al. | |
| 2015/0121964 A1 | 5/2015 | Zhao et al. | |
| 2015/0229028 A1 | 8/2015 | Bily et al. | |
| 2015/0232369 A1 | 8/2015 | Marjanovic et al. | |
| 2015/0318618 A1 | 11/2015 | Chen et al. | |
| 2015/0348940 A1 | 12/2015 | Woychik | |
| 2015/0358021 A1 | 12/2015 | Limb et al. | |
| 2015/0372389 A1 | 12/2015 | Chen et al. | |
| 2016/0122225 A1 | 5/2016 | Wada et al. | |
| 2016/0137548 A1 | 5/2016 | Cabral, Jr. et al. | |
| 2017/0036942 A1 | 2/2017 | Abramov et al. | |
| 2017/0084551 A1 * | 3/2017 | Limb | H01L 23/15 |
| 2017/0217818 A1 | 8/2017 | Dumenil et al. | |
| 2017/0292546 A1 | 10/2017 | Limb et al. | |
| 2018/0005963 A1 | 1/2018 | Limb et al. | |
| 2018/0033577 A1 * | 2/2018 | Whiting | H01L 23/57 |
| 2018/0033742 A1 | 2/2018 | Chua et al. | |
| 2018/0114761 A1 * | 4/2018 | Chua | H01L 23/573 |
| 2019/0106069 A1 * | 4/2019 | Wheeler | B60R 16/0373 |

OTHER PUBLICATIONS

File History for U.S. Appl. No. 15/220,221.
File History for U.S. Appl. No. 15/726,944.
File History for U.S. Appl. No. 15/689,566.
Limb et al., U.S. Appl. No. 15/726,944, filed Oct. 6, 2017.
File History for U.S. Appl. No. 16/033,783.
EP Search Report for EP App. No. 17194476.2 dated Apr. 5, 2018, 9 pages.
File History for U.S. Appl. No. 15/629,506.
File History for U.S. Appl. No. 16/025,573.
U.S. Appl. No. 15/629,506, filed Jun. 21, 2017, Limb et al.
EP Search Report dated Jan. 4, 2018 for EP App. No. 17182800.7, 14 pages.
EP Search Report for EP App. No. 17182802.3 dated Dec. 6, 2017, 9 pages.
File History for EP App. No. 17163445.4 as retrieved from the EP Patent Office electronic file system on Feb. 13, 2018, 74 pages.
File History for U.S. Appl. No. 14/796,440.
File History for U.S. Appl. No. 15/092,313.
File History for U.S. Appl. No. 15/299,385.
File History for U.S. Appl. No. 16/273,397.

* cited by examiner

APPARATUS AND METHOD FOR CREATING CRACK INITIATION SITES IN A SELF-FRACTURING FRANGIBLE MEMBER

TECHNICAL FIELD

This disclosure relates generally to devices comprising self-fracturing frangible members and to related methods and systems.

BACKGROUND

Substrates capable of physically self-fracturing in a controlled, triggerable manner are useful in a variety of applications. For example, self-fracturing substrates supporting electronic systems are useful for maintaining security and supply chain integrity.

BRIEF SUMMARY

Some embodiments are directed to an apparatus comprising a stressed glass member and an actuator mounted on the stressed glass member. A power source is coupled to the actuator. An abrasion structure is disposed between the actuator and the stressed glass member. The abrasion structure comprises abrading features in contact with the stressed glass member. The abrading features have a hardness higher than a hardness of the stressed glass member. When energized by the power source, the actuator is configured to induce movement of the abrasion structure that causes the abrading features to create scratches in the stressed glass member, the scratches or cracks formed at the scratches having a depth sufficient to initiate fracture of the stressed glass member.

Other embodiments are directed to a method comprising energizing an actuator mounted to a stressed glass member, and inducing movement of an abrasion structure using the actuator. The abrasion structure comprises abrading features in contact with the stressed glass member. The abrading features have a hardness higher than a hardness of the stressed glass member. The method comprises creating scratches in the stressed glass member using the abrading features, the scratches or cracks formed at the scratches having a depth sufficient to initiate fracture of the stressed glass member.

BRIEF DESCRIPTION OF DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

Embodiments disclosed herein relate to frangible members capable of self-destructing by fracturing into small pieces in a controlled, triggerable manner. Embodiments disclosed herein relate to frangible glass structures (e.g., panels) capable of self-destructing by fracturing into small pieces in a controlled, triggerable manner. Embodiments disclosed herein relate to electronic devices capable of self-destructing by fracturing into small pieces in a controlled, triggerable manner. Devices and methods disclosed herein are useful in a variety of applications such as government security and supply chain integrity.

Various approaches have been developed to fracture frangible glass by application of mechanical stress (e.g., bending) or rapid melting and quenching using an integrated heater. Although effective, these approaches require significant power to implement. Other approaches have been developed to pre-weaken or pre-damage a region of a frangible glass substrate, thereby reducing the energy needed to break the glass substrate. However, pre-weakening or pre-damaging the frangible glass substrate reduces the reliability of the substrate, resulting in an increased risk of unintentional destruction.

Embodiments of the disclosure are directed to devices and methods that concurrently create a weakened region of a stressed glass member and apply stress to the region sufficient to initiate fracture of the stressed glass member. Embodiments of the disclosure provide for the creation of a weakened region of a stressed glass member at the very moment stress is applied to fracture the stressed glass member, thereby lowering the energy needed to break the stressed glass member without affecting device reliability.

Figure 1A:
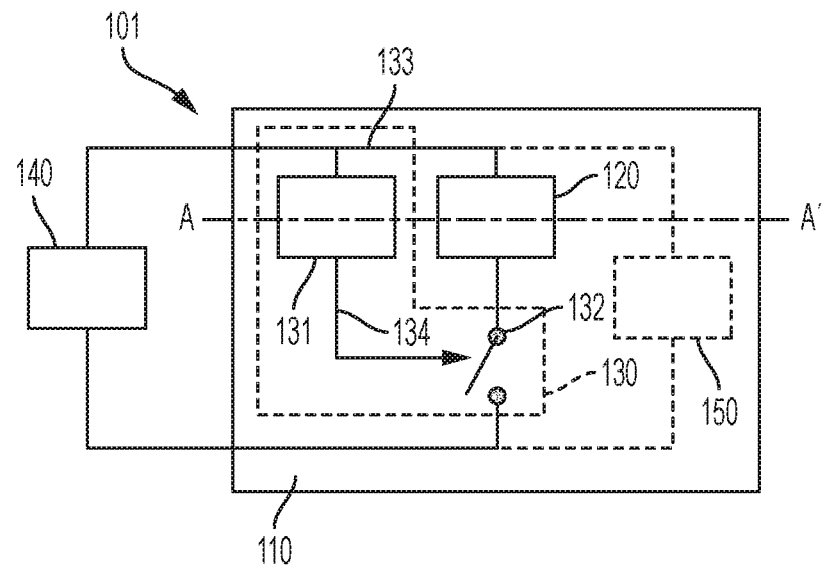
FIGS. 1A, 1B, and 1C show three versions of a self-fracturing device in accordance with some embodiments.
Figure 1B:
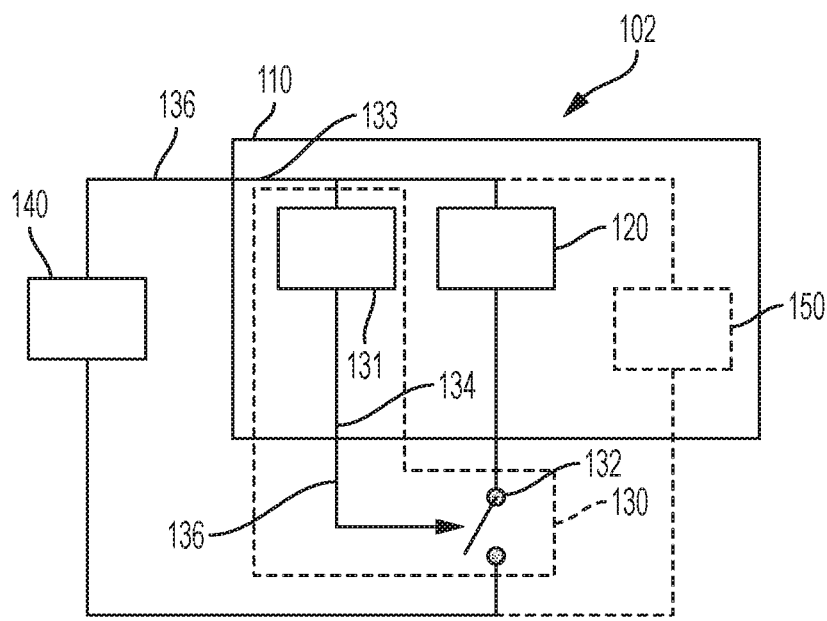
Figure 1C:
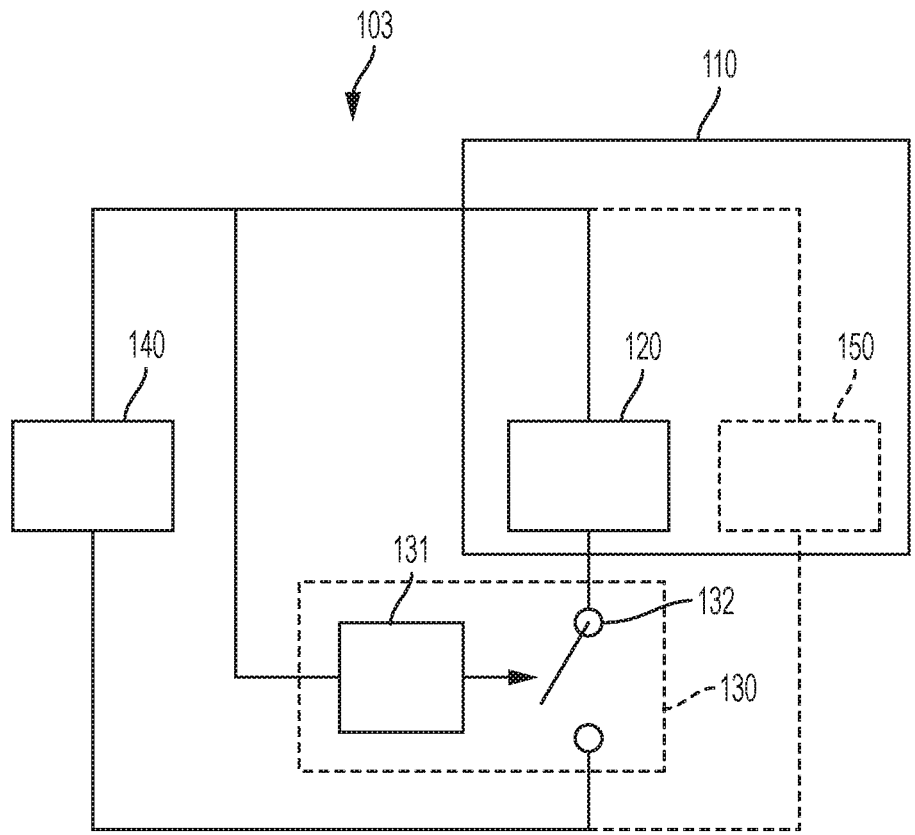

FIGS. 1A, 1B, and 1C show three versions of a self-fracturing device 101, 102, 103 configured to fracture in response to a trigger stimulus. Self-fracturing device 101, 102, 103 includes a stressed glass member 110 and an actuator 120. The actuator 120 is mechanically coupled to the stressed glass member 110. The actuator 120 includes or is coupled to an abrasion structure disposed between the actuator 120 and the stressed glass member 110. The abrasion structure comprises abrading features in contact with the stressed glass member 110. When energized by a power source 140 (e.g., a battery), the actuator 120 is configured to induce movement of the abrasion structure that causes the abrading features to create scratches or stress concentration sites in the stressed glass member 110 to a depth sufficient to initiate fracture of the stressed glass member 110. The scratches create a weakened region of the stressed glass member 110, and a downward force generated by, or acting on, the actuator 120 applies stress to the weakened region, resulting in crack propagation originating at the scratches and fracture of the stressed glass member 110.

In some embodiments, the stressed glass member 110 is a stressed structural glass component, such as a panel. The stressed structural glass component 110 can have any practical shape, including a complex or curved shape. The stressed structural glass component 110 can be a rod (round or square), sheet, tube (round or square), sphere, channel, leg angle, or beam (e.g., I-beam, flange beam) for example.

In other embodiments, the stressed glass member 110 is a stressed glass substrate. According to some embodiments, one or more components 150, e.g., electronic components, may be located on the stressed glass substrate 110 such that when the stressed glass substrate 110 self-fractures, the components 150 are also destroyed. In some implementations, the one or more components 150 may comprise an integrated circuit, such as one that generates or stores a cryptographic key. When the integrated circuit is destroyed, it renders a processor or other system components inaccessible or non-functional. The components 150 may be implemented by patterning suitable materials directly onto the stressed glass substrate 110. The components 150 may be implemented using CMOS fabrication techniques on a semiconductor structure (e.g., IC chip or SOI layer) on which electronic elements are formed. The semiconductor structure can be fixedly attached to the stressed glass substrate 110, such as by anodic bonding. In other embodiments, the stressed glass substrate 110 is devoid of components 150.

Trigger circuitry 130 is configured to cause the actuator 120 to be coupled to the power source 140 in response to a trigger stimulus. The trigger circuitry 130 comprises a sensor 131 and a switch 132. The sensor 131 generates a trigger signal when exposed to the trigger stimulus. The sensor 131 may be configured to sense to a variety of trigger stimuli, such as electromagnetic radiation (e.g., radio frequency (RF) radiation, infrared (IR radiation), visible light, ultraviolet (UV) radiation, x-ray radiation, etc.), vibration, a chemical, vapor, gas, sound, temperature, time, moisture, an environmental condition, etc. For embodiments in which the trigger stimulus is visible light, the sensor 131 may be configured to generate the trigger signal in response to exposure to broadband light, such as sunlight or room light, or narrow band light, such as green, red, or blue visible light. For example, the green, red or blue light may be produced by a laser (e.g., a laser pointer). In some embodiments, the sensor 131 is configured to detect a tampering event. For example, the tampering event can be detected when the device is exposed to a chemical used for removal of a package cover, the device is vibrated above a threshold vibration, and/or when snooping with x-rays occurs. In some embodiments, the sensor 131 senses time from a clock. When a timer expires, an electrical current or voltage trigger signal is generated to trigger the switch 132. In other embodiments, the sensor 131 is a photodiode, e.g., a pn junction diode or p-i-n diode, and the trigger signal is a photocurrent generated by the photodiode in response to visible light or other electromagnetic radiation.

After activation by the trigger signal, the switch 132 electrically couples the power source 140 to the actuator 120. When energized by the power source 140, the actuator 120 is configured to induce in-plane movement of the abrasion structure that creates scratches in the stressed glass member 110. Alternatively, or in addition, the actuator 120 is configured to induce vibration of the abrasion structure that creates scratches in a region of the stressed glass member 110. Concurrently with the movement and/or vibration of the abrasion structure, a downward (normal) force is produced by, or acts on, the actuator 120. This downward force facilitates the production of scratches in the stressed glass member 110 to a depth sufficient to initiate fracture of the stressed glass member 110. The stressed glass member 110 is engineered to self-destruct by fracturing into many pieces. In some embodiments, the fracture dynamics are designed so that the stressed glass member 110 self-destructs by powderizing, where the fractured pieces are small particles such that most particles have length, width, and height dimensions of less than about 900 µm, less than about 500 µm, or even less than about 100 µm.

In one embodiment of the device 101 shown in FIG. 1A, the sensor 131 and switch 132 are located on the stressed glass member 110. In another embodiment of the device 102, shown in FIG. 1B, the switch 132 is not located on the stressed glass member 110. In yet another embodiment of the device 103 shown in FIG. 1C, neither the sensor 131 nor switch 132 is located on the stressed glass member 110. Optionally, in any embodiment of the self-fracturing device 101, 102, 103, one or more components 150, e.g., electronic components, may be located on the stressed glass member 110 such that when the stressed glass member 110 self-fractures, the components 150 are also destroyed.

The process used in preparing the stressed glass member 110, e.g., chemical tempering, imparts a large stress gradient within the thickness of the stressed glass member 110. This stored mechanical energy is abruptly released when a localized area of the stressed glass member 110 is concurrently weakened by abrasion and damaged by stress imparted by the actuator 120. The resulting shock wave causes the stressed glass member 110 to fracture.

Figure 1D:
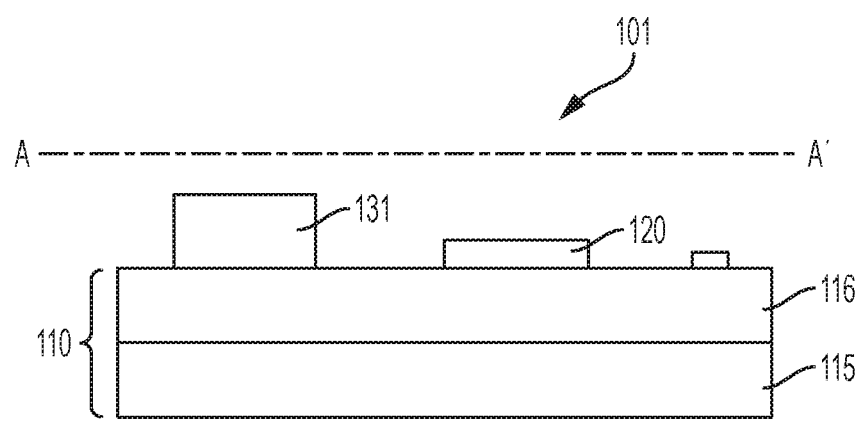
FIG. 1D shows a cross sectional view of a self-fracturing device comprising a stress engineered member in accordance with some embodiments.

As shown in the cross sectional view of FIG. 1D which is taken through line A-A' of FIG. 1A, the stressed glass member 110 may be a structure including at least one tensile stress layer 115 having a residual tensile stress and at least one compressive stress layer 116 having a residual compressive stress. Tensile stress layer 115 and compressive stress layer 116 (collectively referred to herein as "stress-engineered layers") can be operably integrally connected together such that residual tensile and compressive stresses are self-equilibrating and produce a stress gradient. As set forth in additional detail below, the stress-engineered layers 116 and 115 may be fabricated either by post-treating a glass member using strategies similar to glass tempering (e.g., by way of heat or chemical treatment), or by depositing the layers of the member using, for example chemical, vapor deposition techniques in which the deposition parameters (i.e., temperature, pressure, chemistry) are varied such that the layers collectively contain a significant inbuilt stress gradient. Note that the arrangement of stress-engineered layers 116 and 115 indicated in FIG. 1D is not intended to be limiting in that one or more stressed and/or non-stressed layers of the member may be disposed on and/or between the two stress-engineered layers.

Figure 2:
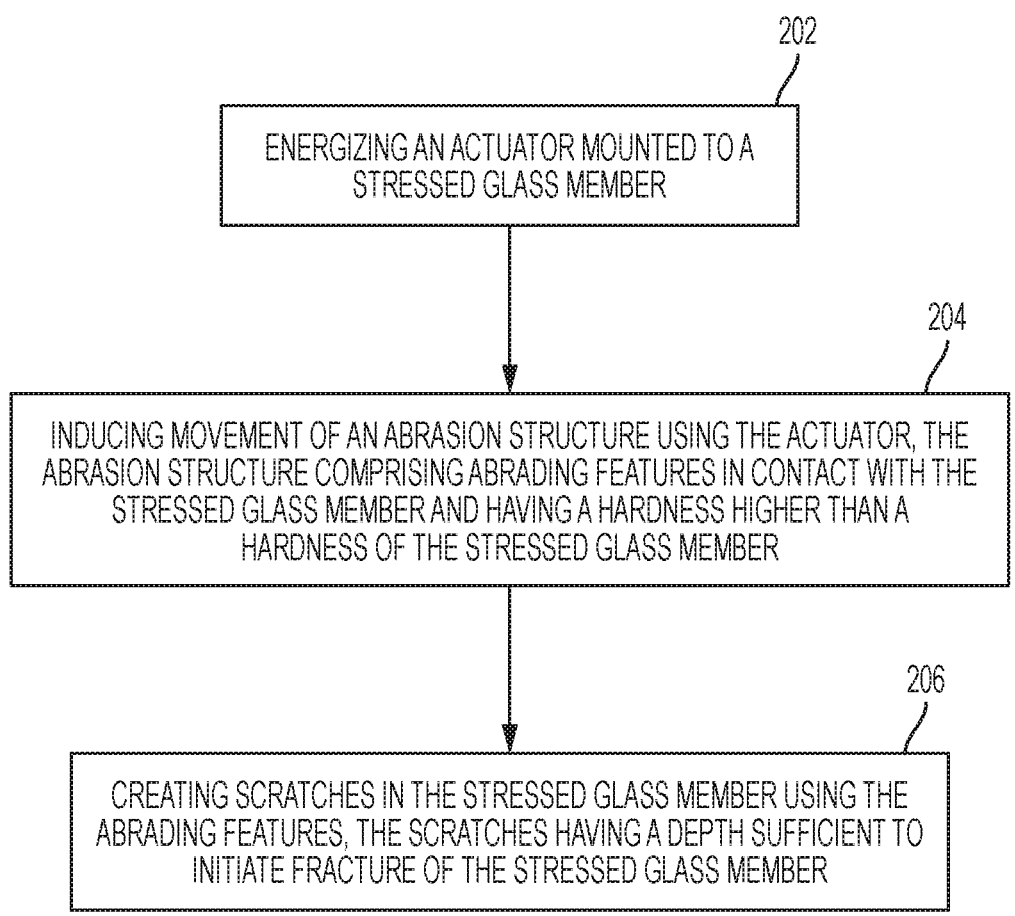
FIG. 2 is a flow diagram illustrating a method of using the self-fracturing device shown in FIGS. 1A-1D in accordance with some embodiments.

FIG. 2 is a flow diagram illustrating a method of using the self-fracturing device 101, 102, 103 shown in FIGS. 1A through 1D. The method show in FIG. 2 involves energizing 202 an actuator mounted to a stressed glass member. Typically, the actuator is energized in response to a trigger signal generated by a sensor when the sensor is exposed to a trigger stimulus. The method also involves inducing movement 204 of an abrasion structure using the actuator. The abrasion structure comprises abrading features in contact with the stressed glass member. The abrading features have a hardness higher than a hardness of the stressed glass member. The method also involves creating scratches in the stressed glass member using the abrading features, the scratches having a depth sufficient to initiate fracture of the stressed glass member. Fracturing the stressed glass member causes the member to break apart into many pieces. In some embodiments, fracturing the stressed glass member causes the member to powderize.

Various methods may be used to generate the stressed glass member 110. One example approach involves thin film sputter deposition. In thin film sputter deposition, generally two distinct regimes can be identified leading to very different film morphology and characteristics, and result in either compressive or tensile stress. Metals are often used because of functionality (e.g., electrical properties), their structural qualities (e.g., ductility), and the fact that a conductive sputter target allows for a simple, high yield, glow discharge DC magnetron sputtering process. However, stress-engineered metal oxides and glasses (silicon oxides) can be sputtered as well; these insulating or semiconducting films can be sputter deposited by either radiofrequency (RF) sputtering or by reactive sputtering in a mixed inert/reactive gas plasma (e.g. argon/oxygen).

To achieve reliable fracturing of the stressed member yielding small fragmentation pieces or particles, a method for generating stressed support members involves adapting stress-engineered thin film fabrication techniques with ion-exchange tempering to create stress profiles in glass ($SiO_2$) members according to various embodiments.

Figure 3A:
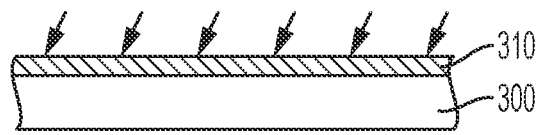
FIGS. 3A to 3E illustrate a first methodology in which a stressed engineered glass member is fabricated in accordance with some embodiments.
Figure 3B:
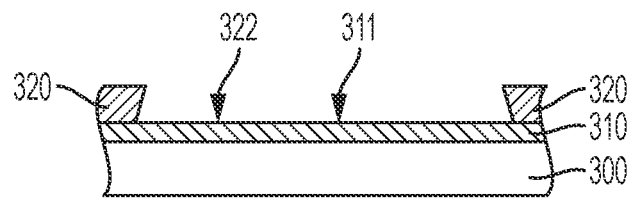
Figure 3C:
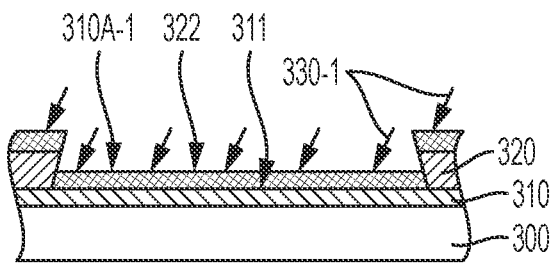
Figure 3D:
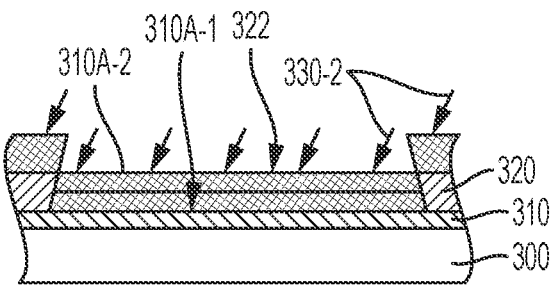
Figure 3E:

FIGS. 3A to 3E illustrate a first methodology in which a stressed support member 310A is built up by patterned $SiO_2$ stressed support members generated entirely using plasma vapor deposition (PVD) techniques. This method provides a high degree of control over the specific stress profile generated in the stressed support member and provides for continuous control over glass formulation and morphology through the thickness dimension of the stressed support member. A wafer 300 (e.g., silicon or other material) is coated with a release layer 310, most likely a metal. In FIG. 3B, a thick liftoff mask 320 is then patterned on release layer 310 such that mask 320 defines an opening 322. Note that wafer 300, release layer 310, and mask 320 form a sacrificial structure. Referring to FIGS. 3C and 3D, PVD processing is then used to create the stress engineered layers 310A-1 and 310A-2 in opening 322, placing stresses in the deposited member material 330-1 and 330-2, for example, by altering the process parameters (e.g., using different temperatures T1 and T2 and/or pressures P1 and P2). Finally, as indicated in FIG. 3E, the mask 320 is then lifted off, and stressed member 310A is singulated (removed) from the remaining sacrificial structure by under-etching the release layer.

Figure 4A:
FIGS. 4A to 4E illustrate a second methodology in which a stressed engineered glass member is fabricated in accordance with some embodiments.
Figure 4B:
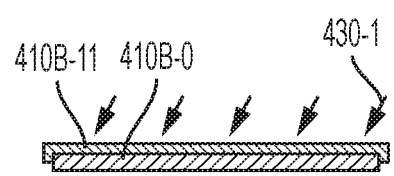
Figure 4C:
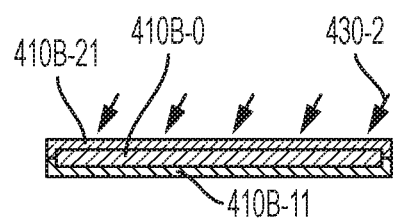
Figure 4D:
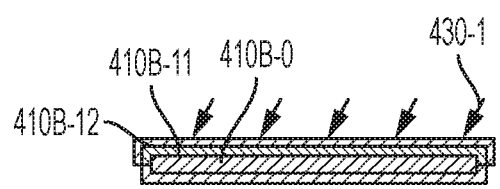
Figure 4E:
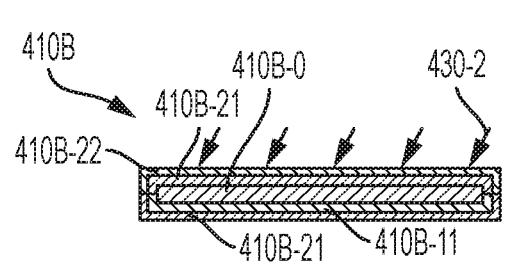

FIGS. 4A to 4E illustrate a second methodology in which a stressed support member 410B is built up by patterned $SiO_2$ on a thin glass core using PVD techniques. This methodology provides a high degree of control over the specific stress profile generated in the stressed support member. Referring to FIG. 4A, the process begins using a substantially unstressed glass core member 410B-0 having a thickness T0 in the range of 25 μm and 100 μm. Suitable glass core members are currently produced by Schott North America, Inc. of Elmsford, N.Y., USA. Referring to FIGS. 4B to 4E, $SiO_2$ is then deposited on alternating sides of core member 410B-0 via PVD using methods similar to those described above. Specifically, FIG. 4B shows the deposition of material 430-1 in a manner that forms stress-engineered layer 410B-11 on core member 410B-0. FIG. 4C shows the deposition of material 430-2 in a manner that forms stress-engineered layer 410B-21 on an opposite side of core member 410B-0. FIG. 4C shows the subsequent deposition of material 430-1 in a manner that forms stress-engineered layer 410B-12 on core layer 410B-11, and FIG. 4E shows the deposition of material 430-2 in a manner that forms stress-engineered layer 410B-22 layer 410B-21. FIG. 4E shows completed stressed support member 410B including core member (central, substantially unstressed layer) 410B-0 with stress-engineered layers 410B-11, 410B-12, 410B-21 and 410B-22 formed thereon.

Figure 5A:
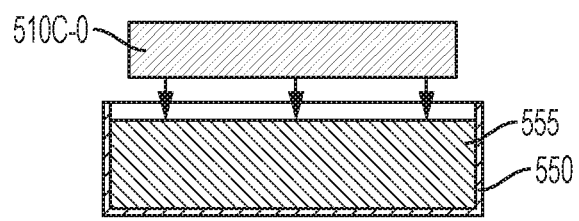
FIGS. 5A to 5E illustrate a third methodology in which a stressed engineered glass member is fabricated in accordance with some embodiments.
Figure 5B:
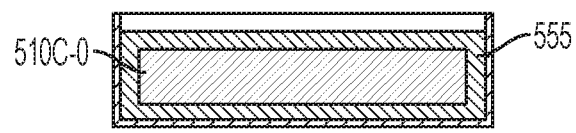
Figure 5C:
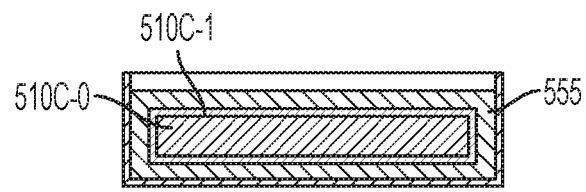
Figure 5D:
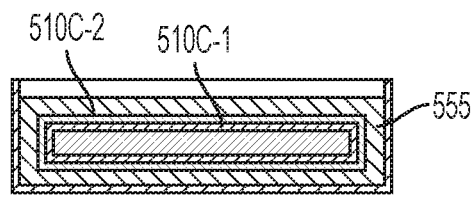
Figure 5E:
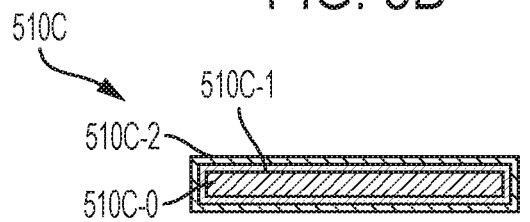

FIGS. 5A to 5E illustrate a third methodology in which a stressed member 510C is produced by subjecting a core member to one of an ion-exchange tempering treatment, a chemical treatment, and a thermal treatment. Specifically, FIGS. 5A to 5E illustrate an exemplary ion-exchange tempering treatment during which various stress profiles are introduced in a core member via molten-salt ion exchange. FIG. 5A shows a core member 510C-0 over a vat 550 containing a molten-salt solution 555. FIG. 5B shows core member 510C-0 immediately after submersion in molten-salt solution 2555. FIG. 5C shows core member 510C-0 after a first time period of submersion in molten-salt solution 555 in which a first stress-engineered layer 510C-1 is formed, and FIG. 5D shows the structure after a second time period of submersion in molten-salt solution 555 in which a second stress-engineered layer 510C-2 is formed on first stress-engineered layer 510C-1. FIG. 5E shows completed stressed support member 500C including central core member 510C-0 and stress-engineered layers 510C-1 and 510C-2.

According to a fourth methodology, a hybrid of the above second and third methods is employed in which diced, thin glass core members are ion-exchange tempered, and then multiple layers of $SiO_2$ are deposited on the tempered members to further increase the induced stresses.

Figure 6A:
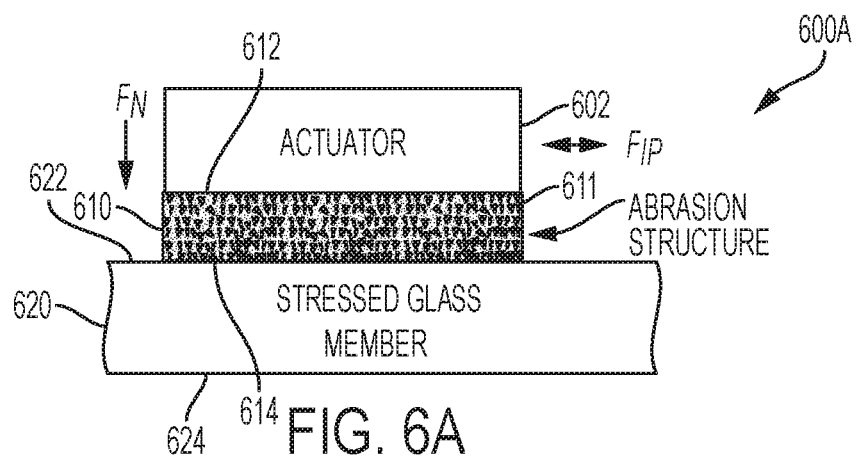
FIGS. 6A and 6B are illustrations of self-fracturing devices in accordance with various embodiments.
Figure 6B:
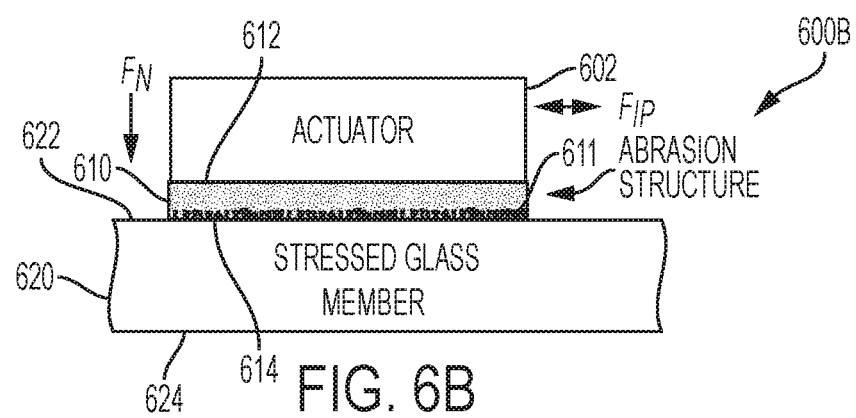

FIGS. 6A and 6B are illustrations of a self-fracturing device 600A, 600B in accordance with various embodiments. The self-fracturing device 600A, 600B includes an actuator 602 mounted on a stressed glass member 620. The stressed glass member 620 can be of a type described hereinabove. An abrasion structure 610 is disposed between the actuator 602 and the stressed glass member 620. The abrasion structure 610 comprises abrading features 611 in contact with the stressed glass member 620. When energized by a power source (e.g., power source 140), the actuator 602 is configured to induce movement of the abrasion structure 610 that causes the abrading features 611 to create scratches in the stressed glass member 620 to a depth sufficient to initiate fracture of the stressed glass member 620.

In some embodiments, the actuator 602 comprises piezoelectric material. The piezoelectric material can comprise zirconate titanate (PZT), barium titanate, zinc oxide, bismuth sodium titanate or gallium phosphate. The piezoelectric material can be a piezoelectric polymer, such as PVDF. The actuator 602 can be implemented to include one or more piezoelectric elements or stages. For example, the actuator 602 can be implemented as a single-mode (e.g., shear-mode) or dual-mode (e.g., shear-mode and bending-mode) piezoelectric actuator. In other embodiments, the actuator 602 can be a motor or a solenoid. In further embodiments, the actuator 602 can be an electrostatic actuator.

The stressed glass member 620 has a first surface 622 and an opposing second surface 624. According to some embodiments, the actuator 602 is configured to move the abrasion structure 610 in-plane with respect to the first surface 622 of the stressed glass member 620. The in-plane movement of the actuator 602 generates an in-plane force, $F_{IP}$, which is transmitted to the abrasion structure 610, causing the abrasion features 611 to create scratches in the first surface 622 of the stressed glass member 620. Concurrently, a downward (normal) force, $F_N$, is generated by, or applied to, the actuator 602. The downward force, $F_N$, is transmitted to the abrasion structure 610, causing the scratches created by the abrasion features 611 to penetrate into the stressed glass member 620 to a depth sufficient to initiate fracture of the stressed glass member 620.

The abrading structure 610 includes a first surface 612 and an opposing second surface 614. In the embodiment shown in FIG. 6A, the abrading features 611 of the abrasion structure 610 are interspersed in a matrix, such as an adhesive. When fabricating the abrasion structure 610, the abrading features 611 can be mixed directly into the matrix. As such, the abrading features 611 are distributed throughout the abrading structure 610 between the first and second surfaces 612, 614. In the embodiment shown in FIG. 6B, the abrading features 611 are placed on the stressed glass member 620 before mounting the actuator 602 to the stressed glass member 620. As such, the abrading features 611 are distributed along the second surface 614 of the abrasion structure 610. In both embodiments, abrading features 611 are distribute along the second surface 614 of the abrasion structure 610 and are in direct contact with the first surface 622 of the stressed glass member 620.

According to various embodiments, the matrix of the abrading structure 610 consists of, or includes, an adhesive. The adhesive serves to bond the actuator 602 to the stressed glass member 620. The matrix is formed from material having a hardness sufficient to support the abrading features 611 when scratching the stressed glass member 620 in response to forces generated by, or applied to, the actuator 602. Suitable adhesives that can be used to fabricate the matrix of the abrading structure 610 include one or a combination of acrylics, epoxies, thermoplastics, cyanoacrylates, and urethanes. It is understood that the actuator 602 can be mounted to the stressed glass member 620 by means other than an adhesive, such as by a direct bond (e.g., anodic bonding) or by coating method such as sputtering.

The abrading features 611 comprise particles having a hardness higher than that of the stressed glass member 620. In some embodiments, the Vickers hardness of the stressed glass member 620 is approximately 6 GPa. Suitable abrading features 611 have a hardness higher than 6 GPa (e.g., preferably equal to or higher than 10 GPa). The abrading features 611 can comprise particles of various so-called superhard materials. For example, the abrading features 611 can comprise one or more of diamond (60-70>GPa), boron carbide (20-30 GPa), silicon carbide (20-30 GPa), cubic boron nitride (40-50 GPa), alumina (10-14 GPa), and zirconia (10-14 GPa) particles.

Figure 7:
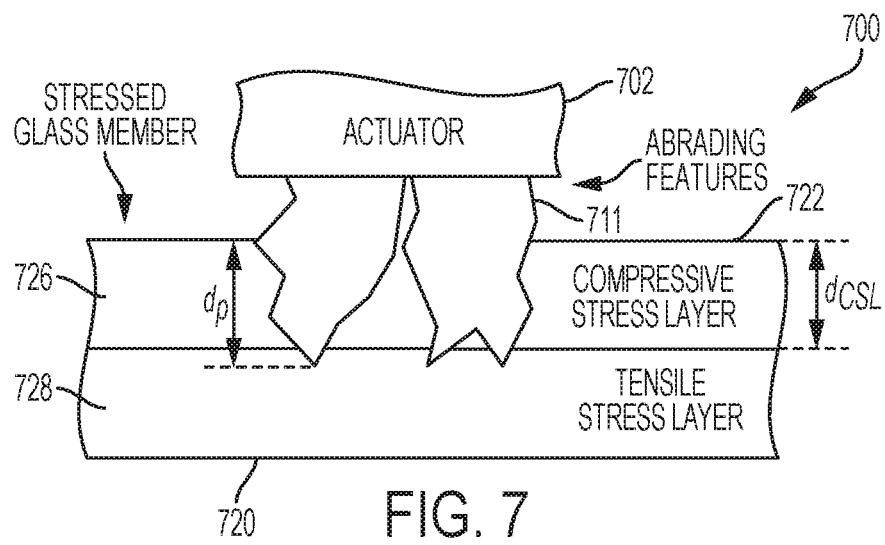
FIG. 7 is in exaggerated illustration showing abrading features of an abrasion structure creating scratches in a stressed glass member in response to forces generated by an actuator in accordance with various embodiments.

FIG. 7 is in exaggerated illustration showing abrading features of an abrasion structure creating scratches in a stressed glass member in response to forces generated by an actuator in accordance with various embodiments. The stressed glass member 720 includes a compressive stress layer 726 and a tensile stress layer 728. The compressive stress layer 726 and the tensile stress layer 728 are operably integrally connected together such that residual compressive and tensile stresses are self-equilibrating and produces a stress gradient, as previously discussed. When energized, the actuator 702 transmits in-plane ($F_{IP}$) and normal ($F_P$) forces to the abrading features 711, causing scratching of the compressive stress layer 726. The scratches create weak points (stress concentration sites) in the compressive stress layer 726. Continued operation of the actuator 702 causes cracks to form at the location of the scratches. Forces applied to the abrading features 711 by the actuator 702 cause the scratches and cracks to penetrate deeper into the compressive stress layer 726 until a predetermined depth, $d_P$, is reached. When the scratches and/or cracks reach the predetermined depth, $d_P$, the mechanical energy stored in the stressed glass member 720 is abruptly released, and the resulting shock wave causes the stressed glass member 720 to fracture.

In FIG. 7, the scratches and/or cracks in the stressed glass member 720 have a depth, $d_P$, sufficient to penetrate through the compressive stress layer 726. This can be achieved by using abrading features 711 having a height that exceeds the thickness of the compressive stress layer 726. In some embodiments, the height of the abrading features 711 can be less than the thickness of the compressive stress layer 726, as long as the cracks forming at the scratches penetrate through the compressive stress layer 726. The depth of the scratches and/or cracks needed to break through the compressive stress layer 726 is dependent on the thickness of the stressed glass member 720. For example, the stressed glass member 720 may have a thickness that requires scratches and/or cracks having a depth ≥100 μm. By way of further example, the stressed glass member 720 may have a thickness of 1 mm or 2 mm, requiring scratches and/or cracks having a depth of about 250 μm.

In some embodiments, the actuator 702 is configured to move the abrasion structure at a frequency that achieves resonance of the stressed glass member 720. At resonance, the stressed glass member 720 will vibrate with larger displacements, resulting in larger stress concentrations at crack initiation sites (scratches), resulting in crack propagation and failure of the stressed glass member 720.

Figure 8:
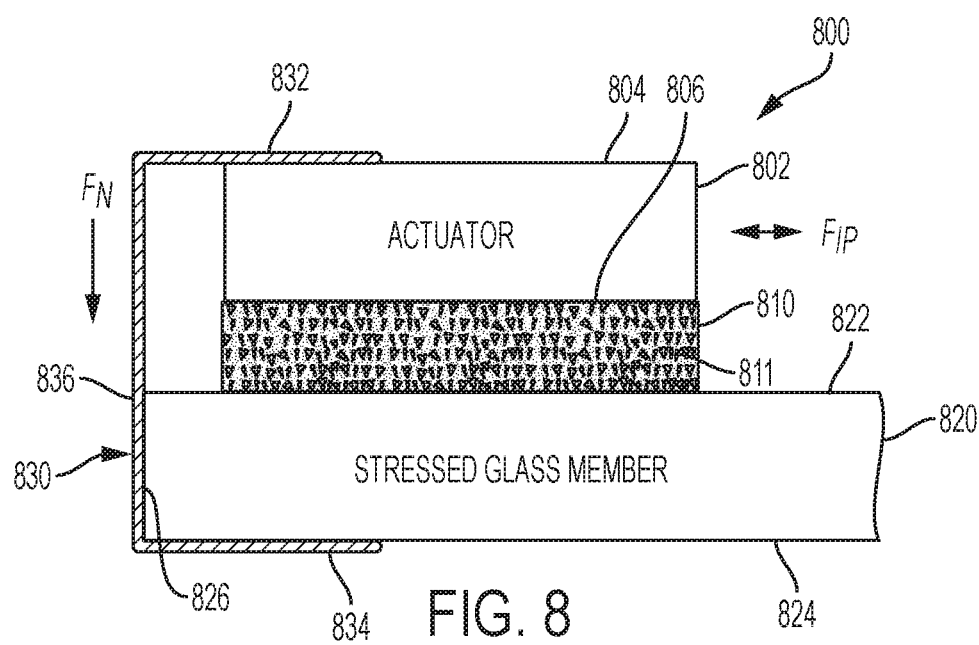
FIG. 8 is an illustration of a self-fracturing device in accordance with various embodiments.

FIG. 8 is an illustration of a self-fracturing device 800 in accordance with various embodiments. The self-fracturing device 800 includes an actuator 802, a stressed glass member 820, and an abrasion structure 810 disposed between the actuator 802 and the stressed glass member 820. The actuator 802 has a first surface 804 and an opposing second surface 806, and the stressed glass member 820 has a first surface 822 and an opposing second surface 824. The actuator 802 is configured to move the abrasion structure 810 in a direction in-plane with respect to the first surface 822 of the stressed glass member 820.

In the embodiment shown in FIG. 8, the self-fracturing device 800 includes a mechanical clamp 830 having a first member 832, a second member 834, and a third member 836 connected to the first and second members 832, 834. The first member 832 is in contact with the first surface 804 of the actuator 802. The second member 834 is in contact with the second surface 824 of the stressed glass member 820. A portion of the third member 836 is shown contacting an edge 826 of the stressed glass member 820, but may be spaced apart from the edge 826. An adhesive may be used to bond the clamp 830 to the actuator 802 and the stressed glass member 820.

A compressive force is generated between the first and second members 832, 834. A component ($F_N$) of the compressive force acts on the actuator 802, which forces the abrasion structure 810 against the first surface 822 of the stressed glass member 820. The compressive force generated by the clamp 830 can be calibrated to ensure that the scratches and/or cracks created by the abrading features 811 penetrate to a predetermined depth, $d_P$, needed to initiate fracture of the stressed glass member 820.

In some embodiments, the clamp 830 can be a spring clamp, in which the compressive force is generated by a spring force generated between the first and second members 832, 834. In other embodiments, the clamp 830 can be a magnetic clamp or an electromagnetic clamp (e.g., coupled to power source 140), such that the compressive force is generated by magnetic attraction between magnetic elements of the first and second members 832, 834.

Figure 9:
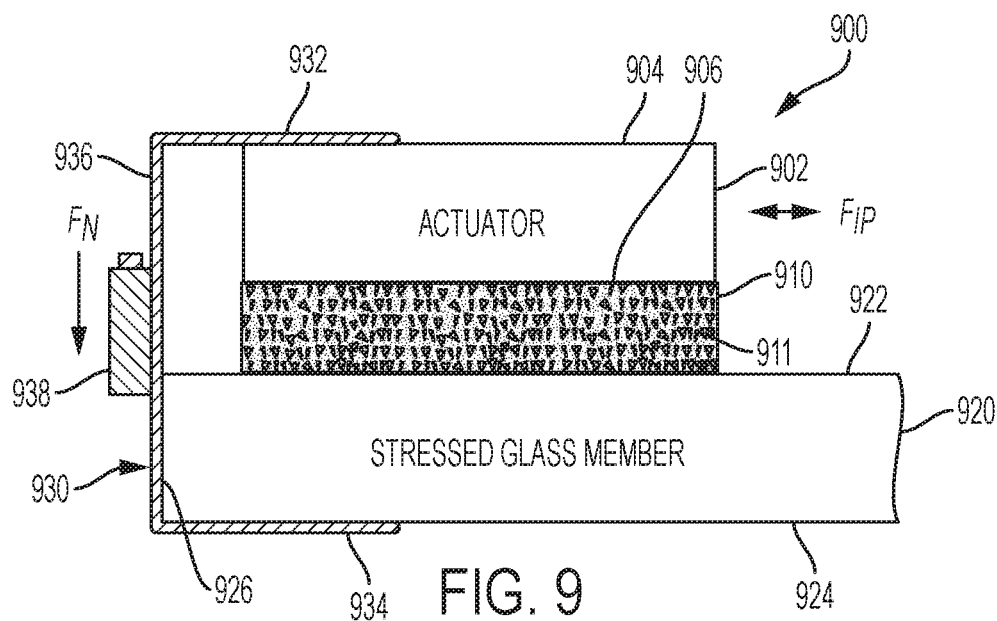
FIG. 9 is an illustration of a self-fracturing device in accordance with various embodiments.

FIG. 9 is an illustration of a self-fracturing device 900 in accordance with various embodiments. The self-fracturing device 900 includes an actuator 902, a stressed glass member 920, and an abrasion structure 910 disposed between the actuator 902 and the stressed glass member 920. The actuator 902 has a first surface 904 and an opposing second surface 906, and the stressed glass member 920 has a first surface 922 and an opposing second surface 924. The actuator 902 is configured to move the abrasion structure 910 in a direction in-plane with respect to the first surface 922 of the stressed glass member 920.

In the embodiment shown in FIG. 9, the self-fracturing device 900 includes a mechanical screw clamp 930 having a first member 932, a second member 934, and a third member 936 connected to the first and second members 932, 934. The first member 932 is in contact with the first surface 904 of the actuator 902. The second member 934 is in contact with the second surface 924 of the stressed glass member 920. A portion of the third member 936 is shown contacting an edge 926 of the stressed glass member 920, but may be spaced apart from the edge 926. An adhesive may be used to bond the clamp 930 to the actuator 902 and the stressed glass member 920.

A compressive force is generated between the first and second members 932, 934. The magnitude of this compressive force can be adjusted by adjustment to a screw arrangement 938 coupled to the third member 936 of the clamp 930. Adjustment of the screw arrangement 938 effectively lengthens or shortens the axial length of the clamp 930. In some embodiments, the clamp 930 can be implemented as a C-clamp. A component ($F_N$) of the compressive force acts on the actuator 902, which forces the abrasion structure 910 against the first surface 922 of the stressed glass member 920. The compressive force generated by the clamp 930 can be calibrated to ensure that the scratches and/or cracks created by the abrading features 911 penetrate to a predetermined depth, $d_P$, needed to initiate fracture of the stressed glass member 920.

Figure 10:
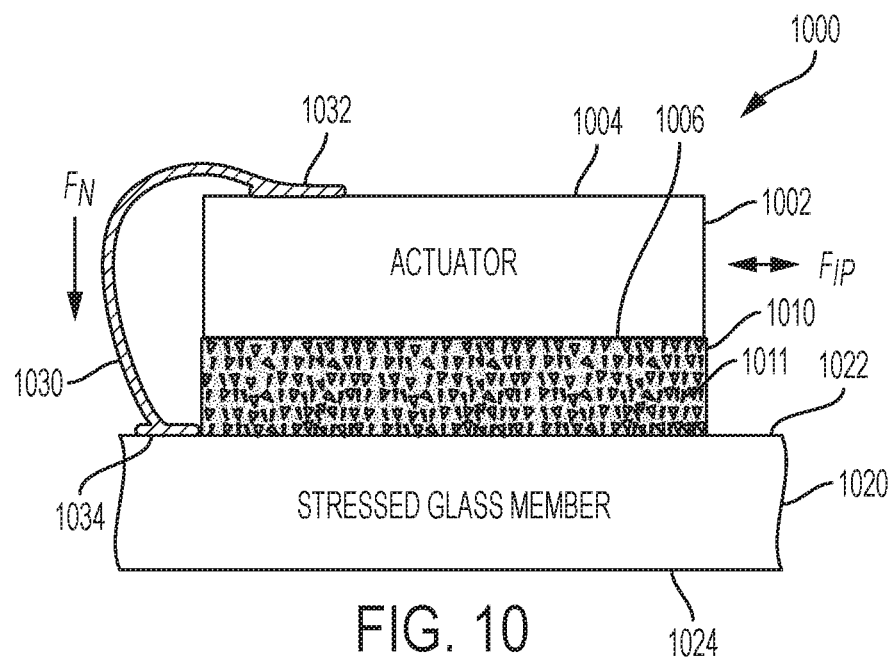
FIG. 10 is an illustration of a self-fracturing device in accordance with various embodiments.

FIG. 10 is an illustration of a self-fracturing device 1000 in accordance with various embodiments. The self-fracturing device 1000 includes an actuator 1002, a stressed glass member 1020, and an abrasion structure 1010 disposed between the actuator 1002 and the stressed glass member 1020. The actuator 1002 has a first surface 1004 and an opposing second surface 1006, and the stressed glass member 1020 has a first surface 1022 and an opposing second surface 1024. The actuator 1002 is configured to move the abrasion structure 1010 in a direction in-plane with respect to the first surface 1022 of the stressed glass member 1020.

In the embodiment shown in FIG. 10, the self-fracturing device 1000 includes a leaf spring 1030 having a first end 1032 and a second end 1034. The first end 1032 is in contact with the first surface 1004 of the actuator 1002. The second end 1034 is in contact with the first surface 1022 of the stressed glass member 1020. An adhesive may be used to bond the clamp 1030 to the actuator 1002 and the stressed glass member 1020.

A compressive force is generated between the first and second ends 1032, 1034. A component ($F_N$) of the compressive force acts on the actuator 1002, which forces the abrasion structure 1010 against the first surface 1022 of the stressed glass member 1020. The compressive force generated by the clamp 1030 can be calibrated to ensure that the scratches and/or cracks created by the abrading features 1011 penetrate to a predetermined depth, $d_P$, needed to initiate fracture of the stressed glass member 1020.

Figure 11:
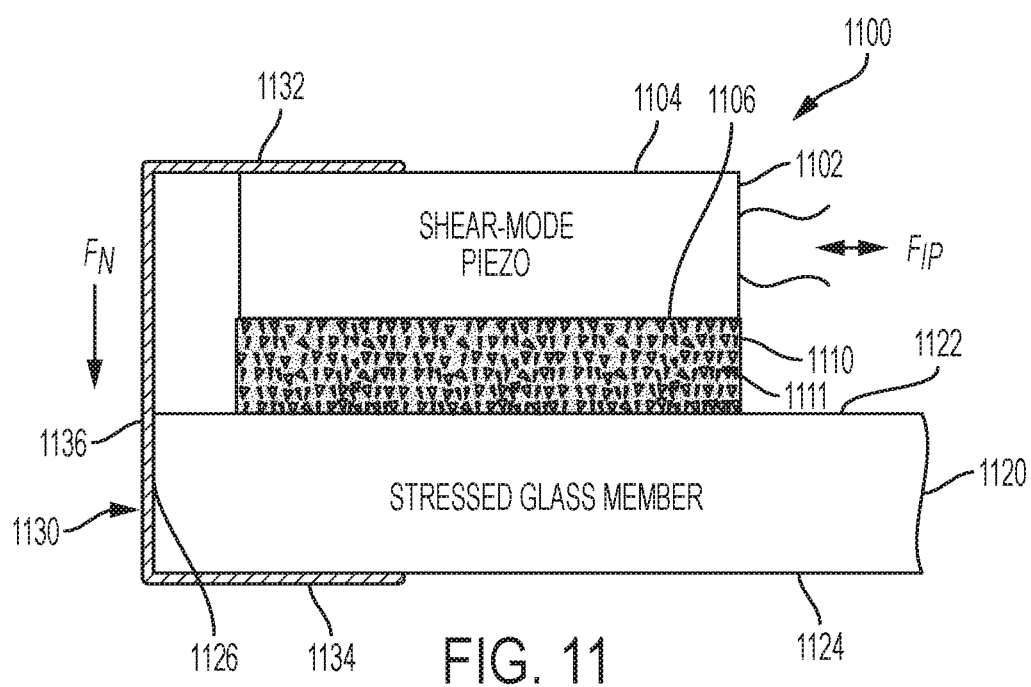
FIG. 11 is an illustration of a self-fracturing device in accordance with various embodiments.

FIG. 11 is an illustration of a self-fracturing device 1100 in accordance with various embodiments. The self-fracturing device 1100 includes an actuator 1102, a stressed glass member 1120, and an abrasion structure 1110 disposed between the actuator 1102 and the stressed glass member 1120. In the embodiment shown in FIG. 11, the actuator 1102 comprises a shear-mode piezoelectric stage or actuator. Suitable shear-mode piezoelectric stages, elements and actuators are available from APC International, Ltd., Mackeyville, Pa. The actuator 1102 has a first surface 1104 and an opposing second surface 1106, and the stressed glass member 1120 has a first surface 1122 and an opposing second surface 1124. The actuator 1102 is configured to move the abrasion structure 1110 in a direction in-plane with respect to the first surface 1122 of the stressed glass member 1120.

In the embodiment shown in FIG. 11, the self-fracturing device 1100 includes a clamp 1130 having a first member 1132, a second member 1134, and a third member 1136 connected to the first and second members 1132, 1134. The first member 1132 is in contact with the first surface 1104 of the actuator 1102. The second member 1134 is in contact with the second surface 1124 of the stressed glass member 1120. A portion of the third member 1136 is shown contacting an edge 1126 of the stressed glass member 1120, but may be spaced apart from the edge 1126. In another embodiment, the clamp 1130 can be replaced by the leaf spring 1030 shown in FIG. 10. An adhesive may be used to bond the clamp 1130 or the leaf spring 1030 to the actuator 1102 and the stressed glass member 1120.

A compressive force is generated by the clamp 1130 or the leaf spring 1030. A component ($F_N$) of the compressive force acts on the actuator 1102, which forces the abrasion structure 1110 against the first surface 1122 of the stressed glass member 1120. The compressive force generated by the clamp 1130 or leaf spring 1030 can be calibrated to ensure that the scratches and/or cracks created by the abrading features 1111 penetrate to a predetermined depth, $d_P$, needed to initiate fracture of the stressed glass member 1120.

Figure 12:
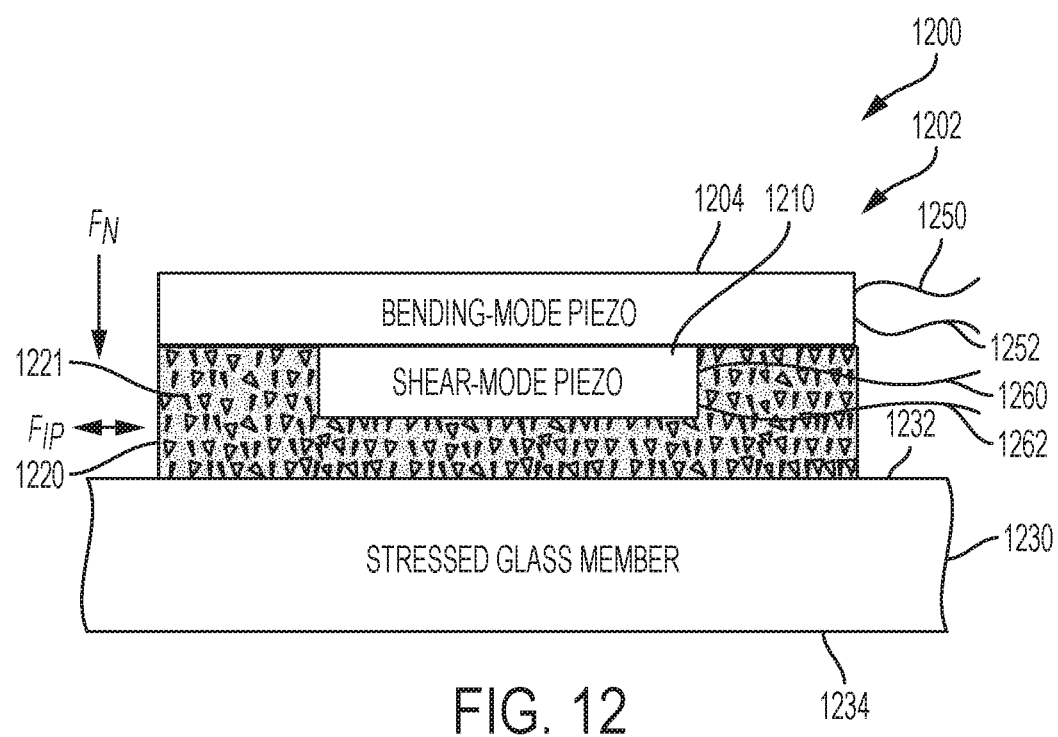
FIG. 12 is an illustration of a self-fracturing device in accordance with various embodiments.

FIG. 12 is an illustration of a self-fracturing device 1200 in accordance with various embodiments. The self-fracturing device 1200 includes an actuator 1202, a stressed glass member 1230, and an abrasion structure 1220 disposed between the actuator 1202 and the stressed glass member 1230. In the embodiment shown in FIG. 12, the actuator 1202 is implemented as a piezoelectric actuator comprising a shear-mode piezoelectric stage or actuator 1210 and a bending-mode piezoelectric stage or actuator 1204. Suitable shear-mode and bending-mode piezoelectric stages, elements and actuators are available from APC International, Ltd., Mackeyville, Pa.

As shown in FIG. 12, the shear-mode piezoelectric stage 1210 is situated between the bending-mode piezoelectric stage 1204 and the stressed glass member 1230. Edges of the bending-mode piezoelectric stage 1204 extend beyond edges of the shear-mode piezoelectric stage 1210. The edges of the bending-mode piezoelectric stage 1204 are bonded to the stressed glass member 1230 by the adhesive of the abrasion structure 1220. In FIG. 12, the shear-mode piezoelectric stage 1210 is in contact with the bending-mode piezoelectric stage 1204. Alternatively, the shear-mode piezoelectric stage 1201 can be spaced apart from the bending-mode piezoelectric stage 1204.

When energized via leads 1260, 1262, the shear-mode piezoelectric stage 1210 is configured to move the abrasion structure 1220 in a direction in-plane with respect to the first surface 1232 of the stressed glass member 1230. When energized via leads 1250, 1252, the bending-mode piezoelectric stage 1210 is configured to bend concave up, which produces a downward force ($F_N$) on the abrasion structure 1220. The in-plane and downward forces ($F_{IP}$, $F_N$) acting on the abrasion structure 1220 causes the abrasion features 1221 to create scratches in the first surface 1232 of the stressed glass member 1230. The downward force generated by the bending-mode piezoelectric stage 1210 can be calibrated to ensure that the scratches and/or cracks created by the abrading features 1221 penetrate to a predetermined depth, $d_P$, needed to initiate fracture of the stressed glass member 1230.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Various modifications and alterations of the embodiments discussed above will be apparent to those skilled in the art, and it should be understood that this disclosure is not limited to the illustrative embodiments set forth herein. The reader should assume that features of one disclosed embodiment can also be applied to all other disclosed embodiments unless otherwise indicated. It should also be understood that all U.S. patents, patent applications, patent application publications, and other patent and non-patent documents referred to herein are incorporated by reference, to the extent they do not contradict the foregoing disclosure.

The invention claimed is:

1. A fracturable apparatus, comprising:
    a stressed glass member;
    an actuator bonded to the stressed glass member;
    a power source coupled to the actuator; and
    an abrasion structure disposed between the actuator and the stressed glass member, the abrasion structure comprising a plurality of abrading features in contact with the stressed glass member and having a hardness higher than a hardness of the stressed glass member;
    wherein, when energized by the power source, the actuator is configured to induce movement of the abrasion structure in-plane with respect to the stressed glass member that causes the abrading features to create scratches in the stressed glass member, the scratches or cracks formed at the scratches having a depth sufficient to initiate fracture of the stressed glass member.

2. The apparatus of claim 1, wherein the actuator is configured to apply a force to the abrasion structure in a direction normal to the surface of the stressed glass member.

3. The apparatus of claim 1, wherein:
    the apparatus comprises a clamp or a spring coupled to the actuator and the stressed glass member, the clamp or spring configured to apply a force to the actuator and the abrasion structure in a direction normal to the surface of the stressed glass member.

4. The apparatus of claim 1, wherein the actuator comprises piezoelectric material.

5. The apparatus of claim 1, wherein the actuator comprises:
    a first piezoelectric stage configured to cause movement of the abrasion structure in-plane with respect to the stressed glass member; and
    a second piezoelectric stage configured to cause movement of the abrasion structure in a direction normal to the surface of the stressed glass member.

6. The apparatus of claim 1, wherein the actuator comprises:
    a piezoelectric stage configured to cause movement of the abrasion structure in-plane with respect to the stressed glass member; and
    a clamp or spring arrangement configured to produce a force on the piezoelectric stage and the abrasion structure in a direction normal to the surface of the stressed glass member.

7. The apparatus of claim 1, wherein the actuator comprises a motor, a solenoid or an electrostatic actuator.

8. The apparatus of claim 1, wherein the abrasion structure comprises an adhesive, and the abrading features are interspersed within the adhesive at least along a surface of the abrasion structure that contacts the stressed glass member.

9. The apparatus of claim 1, wherein the abrading features comprise one or more of diamond, boron carbide, silicon carbide, cubic boron nitride, alumina, and zirconia.

10. The apparatus of claim 1, wherein:
    the stressed glass member comprises at least one tensile stress layer having a residual tensile stress and at least one compressive stress layer having a residual compressive stress and being mechanically coupled to the at least one tensile stress layer such that the at least one tensile stress layer and the at least one compressive stress layer are self-equilibrating; and
    the scratches or cracks forming at the scratches in the stressed glass member have a depth sufficient to penetrate through the at least one compressive stress layer.

11. The apparatus of claim 1, wherein the actuator is configured to induce movement of the abrasion structure to achieve resonance of the stressed glass member.

12. The apparatus of claim 1, comprising trigger circuitry coupled to the power source, the trigger circuitry configured to cause the power source to energize the actuator in response to a trigger stimulus.

13. The apparatus of claim 1, wherein:
    the stressed glass member comprises a stressed glass substrate; and
    one or more electronic devices having at least one transistor are disposed on the stressed glass substrate such that fracture of the stressed glass substrate fractures the one or more electronic devices.

14. A method implemented by a fracturable apparatus, comprising:
    energizing an actuator bonded to a stressed glass member;
    inducing movement of an abrasion structure in-plane with respect to the stressed glass member using the actuator, the abrasion structure comprising a plurality of abrading features in contact with the stressed glass member and having a hardness higher than a hardness of the stressed glass member; and
    creating scratches in the stressed glass member using the abrading features, the scratches or cracks formed at the scratches having a depth sufficient to initiate fracture of the stressed glass member.

15. The method of claim 14, wherein inducing movement of the abrasion structure using the actuator comprises:
inducing movement of the abrasion structure in a direction normal to the surface of the stressed glass member.

16. The method of claim 14, wherein the abrasion structure comprises an adhesive, and the abrading features are interspersed within the adhesive at least along a surface of the abrasion structure that contacts the stressed glass member.

17. The method of claim 14, wherein the abrading features comprise one or more of diamond, boron carbide, silicon carbide, cubic boron nitride, alumina, and zirconia.

18. The method of claim 14, wherein:
the stressed glass member comprises at least one tensile stress layer having a residual tensile stress and at least one compressive stress layer having a residual compressive stress and being mechanically coupled to the at least one tensile stress layer such that the at least one tensile stress layer and the at least one compressive stress layer are self-equilibrating; and
creating the scratches comprises creating the scratches or cracks formed at the scratches in the stressed glass member to a depth sufficient to penetrate through the at least one compressive stress layer.

19. The method of claim 14, wherein the induced movement of the abrasion structure achieves resonance of the stressed glass member.

20. The method of claim 14, comprising:
generating a trigger signal in response to a trigger stimulus;
wherein the actuator is energized in response to the trigger signal.

21. The method of claim 14, wherein:
the stressed glass member comprises a stressed glass substrate;
one or more electronic devices having at least one transistor are disposed on the stressed glass substrate; and
initiating fracture of the stressed glass substrate causes fracture of the one or more electronic devices.

* * * * *